(12) United States Patent
Endoh

(10) Patent No.: US 7,525,318 B2
(45) Date of Patent: Apr. 28, 2009

(54) LOAD ABNORMALITY DETECTING SYSTEM AND METHOD

(75) Inventor: Takeshi Endoh, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 91 days.

(21) Appl. No.: 11/714,448

(22) Filed: Mar. 6, 2007

(65) Prior Publication Data

US 2007/0210804 A1  Sep. 13, 2007

(30) Foreign Application Priority Data

Mar. 7, 2006 (JP) ............................. 2006-060555

(51) Int. Cl.
*G01R 31/08* (2006.01)

(52) U.S. Cl. .................. 324/522; 340/458; 340/644; 361/100; 320/132; 323/201

(58) Field of Classification Search ............... 324/522; 60/284
See application file for complete search history.

(56) References Cited

U.S. PATENT DOCUMENTS 4,259,659 A * 3/1981 Ariyoshi et al. ............. 340/458
4,955,069 A * 9/1990 Ionescu ...................... 388/811
5,623,254 A * 4/1997 Brambilla et al. ........... 340/644
5,859,757 A * 1/1999 Hanafusa et al. ............ 361/100
6,194,868 B1 * 2/2001 De Boer ..................... 320/132
6,275,422 B1    8/2001 Javanifard et al.
2006/0197508 A1* 9/2006 Matsumoto et al. ......... 323/201

FOREIGN PATENT DOCUMENTS

JP            8-189845            7/1996

* cited by examiner

*Primary Examiner*—Timothy J Dole
*Assistant Examiner*—Benjamin M Baldridge
(74) *Attorney, Agent, or Firm*—Gerald E. Hespos; Anthony J. Casella

(57) ABSTRACT

A load abnormality detecting system and method for detecting the burnout and short circuit of a load are provided. A voltage generator (10) generates a specified voltage Vs in accordance with a load current IL. A judging device (4) compares a signal corresponding to this voltage (Vs) with a specified reference value (T1, T2) to judge whether a load (2) has any abnormality. A selector (6) causes the burnout reference value (T1) to be inputted to the judging device (4) and controls the voltage generator (10) to use a first resistance value when checking the burnout of the load (2) while causing the short-circuit reference value (T2) to be inputted to the judging device (4) and controlling the voltage generator (10) to use a second resistance value when checking the short circuit of the load (2).

11 Claims, 2 Drawing Sheets

LOAD ABNORMALITY DETECTING SYSTEM AND METHOD

BACKGROUND OF THE INVENTION

1. Field of the Invention

The invention relates to a load abnormality detecting system and method for detecting the burnout and short circuit of a load.

2. Description of the Related Art

The construction of a conventional load abnormality detecting system 30 is shown in FIG. 2. The conventional load abnormality detecting system 30 has a current sensor 1 that causes a signal current Is corresponding to an amount of a load current IL flowing through a load 2 to be generated and outputs the signal current Is. A relationship of signal current Is=load current IL/K (K: constant) holds between the signal current Is and the load current IL.

A resistor R is disposed between a wire, in which the signal current Is flows, and a ground potential. Accordingly, a voltage Vs corresponding to an amount of the signal current Is is generated at a connection point of the wire to the resistor R. Here, the voltage Vs is a product of the signal current Is and a resistance value r, Is×r, if r denotes the resistance value of the resistor R.

The voltage Vs is converted into a digital signal in an AD converter 3, and the digital signal is inputted to one input portion of a judging device 4. A burnout reference value T1 or a short-circuit reference value T2 is inputted to the other input portion of the judging device 4.

If the burnout of the load 2 wants to be checked, the burnout reference value T1 is caused to be inputted to the other input portion of the judging device 4 by controlling a selecting means 5. The selecting means 5 is for switching the selection by means of an electrical changeover switch or a software control. The burnout of the load 2 is judged by comparing the inputted digital signal and the burnout reference value T1 in the judging device 4.

On the contrary, if the short circuit of the load 2 wants to be checked, the short-circuit reference value T2 is caused to be inputted to the other input portion of the judging device 4 by controlling the selecting means 5. The short circuit of the load 2 is judged by comparing the inputted digital signal and the short-circuit reference value T2 in the judging device 4.

Here, the AD converter 3, the judging device 4, the selecting means 5 and the like are incorporated into a microcomputer 20. In other words, whether or not the load 2 has any abnormality such as burnout or short circuit can be judged in the microcomputer 20.

Technology concerning the current sensor 1 is disclosed in Japanese Patent Office's Standard Technology Collection "High-Side Current Power Switch". Further, technology relating to the present invention (technology of changing a range by switching resistors) is disclosed in Japanese Unexamined Patent Publication No. H08-189845.

In the load abnormality detecting system 30 shown in FIG. 2, the load current IL decreases in the case of burnout in the load 2. Accordingly, the signal current Is decreases and the voltage Vs also decreases as the load current IL decreases as described above. To precisely detect the burnout of the load 2 in the judging device 4, the voltage Vs is desirably larger to improve conversion precision in the AD converter 3. Here, the voltage Vs generated in correspondence with the amount of the signal current Is depends on the resistance value r of the resistor R. Accordingly, it is better to set a large resistance value r of the resistor R in order to precisely judge the burnout in the judging device 4 in the case of the burnout in the load 2.

However, an upper limit is defined for the voltage value inputted to the AD converter 3 incorporated into the microcomputer 20 based on the electrical specification of the AD converter 3 and the like (i.e. an upper limit is defined for the voltage Vs generated in the voltage generator constructed by the resistor R). Accordingly, if the resistance value r of the resistor R is increased only in light of the burnout of the load 2, the voltage Vs having a value in excess of the upper limit may be inputted to the AD converter 3 in the event of the short circuit of the load 2. This is because the load current IL increases in the case of the short circuit in the load 2, and both the signal current Is and the voltage Vs increase as the load current IL increases.

Because of the above, in the actual load abnormality detecting system 30, the resistance value r of the resistor R has been set to a relatively small value so that the voltage value inputted to the AD converter 3 does not exceed the upper limit value of the AD converter 3 also in the event of the short circuit in the load 2.

As described above, the resistance value r of the resistor R needs to be restricted in the conventional load abnormality detecting system 30. Accordingly, in this load abnormality detecting system 30, the resistance value r of the resistor R is set in consideration of accuracy in detecting the short circuit of the load 2 in the event of the short circuit of the load 2 and accuracy in detecting (i.e., judging) the burnout of the load 2 in the event of the burnout of the load 2. Therefore, it has been difficult to improve both accuracies.

Accordingly, an object of the invention is to provide a load abnormality detecting system and method capable of detecting both the short circuit of a load and the burnout of the load with high accuracy even if an upper limit is defined for the value of a voltage to be generated in a voltage generator.

SUMMARY OF THE INVENTION

The invention relates to a load abnormality detecting system that has a voltage generator for generating a specified voltage in accordance with an amount of a current flowing to a load present outside of the system. The system also has a judging device for judging whether the load has any abnormality by comparing a signal corresponding to the specified voltage and a burnout reference value and/or a short-circuit reference value. A selector is provided for causing either one of the burnout reference value and the short-circuit reference value to be selectively inputted to a first input portion of the judging device. The voltage generator includes a first resistor between a second input portion of the judging device and a reference potential, and a second resistor connected in parallel with the first resistor between the second input portion of the judging device and the reference potential. The selector causes the burnout reference value to be inputted to the first input portion of the judging device and controls the voltage generator so as not to form a current path via the second resistor when checking the burnout of the load while causing the short-circuit reference value to be inputted to the first input portion of the judging device and controlling the voltage generator to form the current path via the second resistor when checking the short circuit of the load.

The voltage generator of the load abnormality detecting system is constructed so that the first and second resistors are arranged in parallel between the second input portion of the judging device and the reference potential. Further, the selector causes the burnout reference value to be inputted to the judging device and controls the voltage generator so as not to form the current path via the second resistor when checking the burnout of the load, while causing the short-circuit reference value to be inputted to the judging device and controlling the voltage generator so as to form the current path via the second resistor when checking the short circuit of the load. Accordingly, the voltage generator generates a voltage dependent on a resistance value of the first resistor when checking the burnout of the load. Further, the voltage generator generates a voltage dependent on a synthetic resistance value of the first and second resistors at the time of checking the short circuit of the load. Thus, even if the resistance value of the first resistor is set at a large value, the synthetic resistance value of the first and second resistors is smaller than the first resistance value. Therefore, even if an upper limit is defined for voltages to be generated by the voltage generator, both the short circuit of the load and the burnout of the load can be detected with high accuracy. In other words, an error in detecting the abnormality of the load can be prevented.

The voltage generator further includes a switching circuit connected in series with the second resistor between the second input portion of the judging device and the reference potential and on-off controlled in accordance with a control signal from the selector. The selector preferably outputs a control signal to turn the switching circuit off when detecting the burnout of the load, while outputting a control signal to turn the switching circuit on when detecting the short circuit of the load. Thus, a system for switching a resistance value in the voltage generator when the burnout of the load is detected and when the short circuit of the load is detected has a simple construction.

Most preferably, the specified voltage Vs is given by $$Vs = Is \times \{r1 \cdot r2/(r1+r2)\}$$

where Is is the signal current, r1 is the resistance value of the first resistor, and r2 is the resistance value of the second resistor.

According to the invention, there is further provided a load abnormality detecting method that may be used with the above-described load abnormality detecting system. The method includes a generating step of generating a specified voltage in accordance with an amount of a current flowing to a load present outside, a judging step of judging whether the load has any abnormality by comparing a signal corresponding to the specified voltage and a burnout reference value and/or a short-circuit reference value, and a selecting step for causing one of the burnout reference value and the short-circuit reference value to be selectively inputted to a first input portion of the judging device. The voltage is generated in the generation step by disposing a first resistor between a second input portion of the judging device and a reference potential, and connecting a second resistor in parallel with the first resistor between the second input portion of the judging device and the reference potential. In the selecting step, the burnout reference value is input to the first input portion of the judging device and avoided to form a current path via the second resistor in the case of checking the burnout of the load. However, the short-circuit reference value is input to the first input portion of the judging device and the current path is formed via the second resistor in the case of checking the short circuit of the load.

The voltage generation step preferably further includes a switching step by means of a switching circuit connected in series with the second resistor between the other input portion of the judging device and the reference potential and on-off controlled in accordance with a control signal from the selector.

A control signal preferably is output in the selecting step to turn the switching circuit off in the case of detecting the burnout of the load while a control signal is output to turn the switching circuit on in the case of detecting the short circuit of the load.

Most preferably, voltage Vs is given by $$Vs = Is \times \{r1 \cdot r2/(r1+r2)\}$$

where Is is the signal current, r1 is the resistance value of the first resistor, and r2 is the resistance value of the second resistor.

These and other objects, features and advantages of the present invention will become more apparent upon reading of the following detailed description of preferred embodiments and accompanying drawings. It should be understood that even though embodiments are separately described, single features thereof may be combined into additional embodiments.

DETAILED DESCRIPTION OF THE PREFERRED EMBODIMENTS

Figure 1:
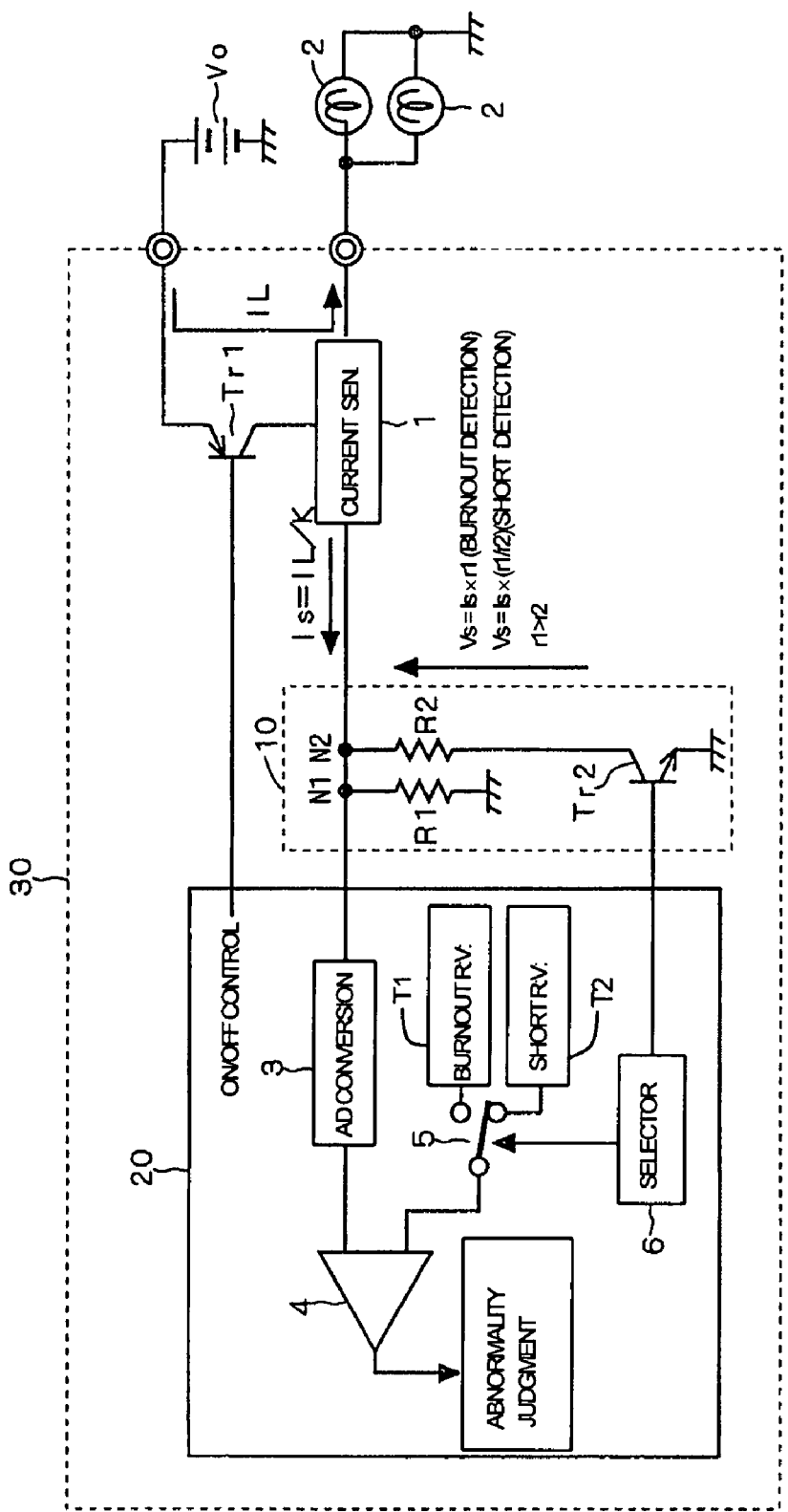
FIG. 1 is a circuit diagram showing the construction of a load abnormality detecting system according to the invention.
Figure 2:
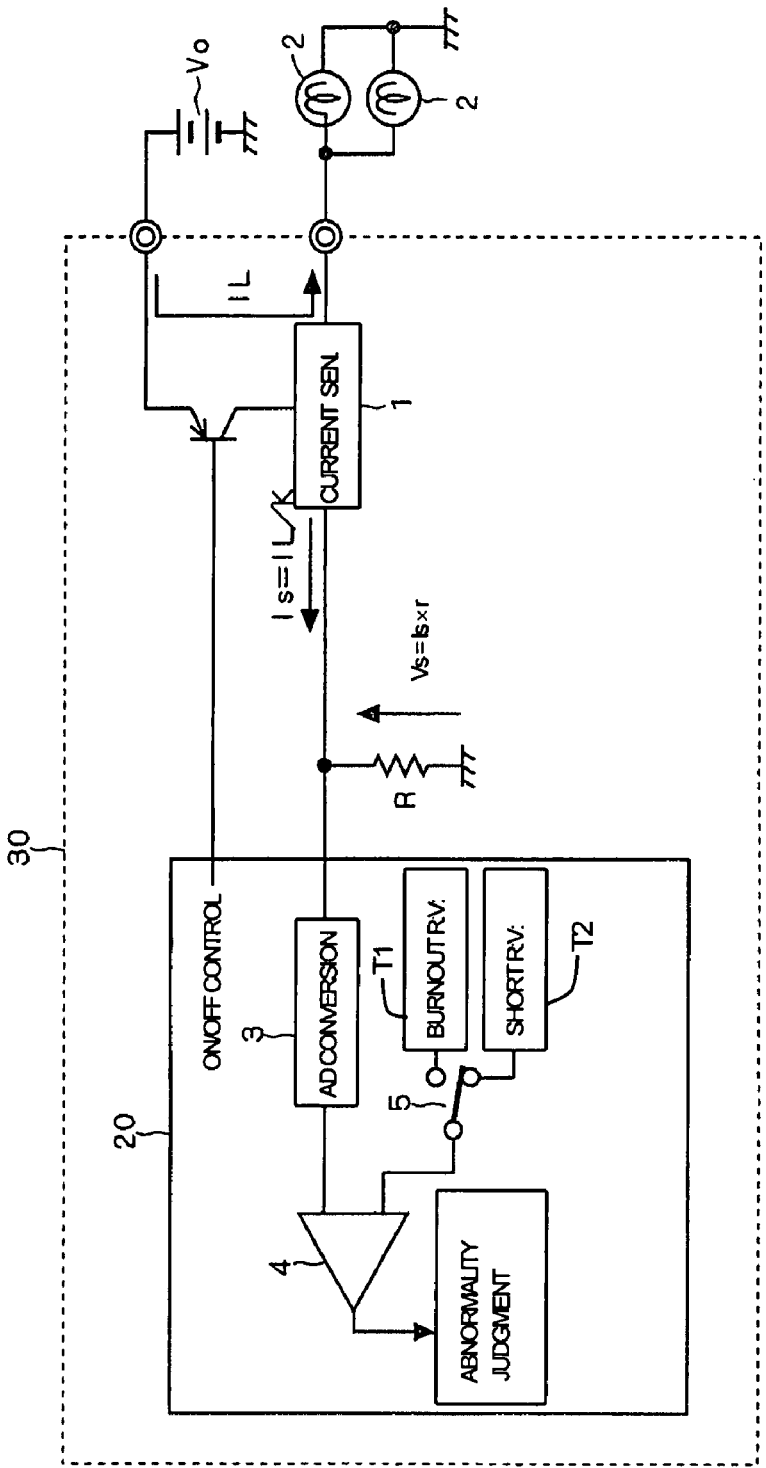
FIG. 2 is a circuit diagram showing the construction of a load abnormality detecting system according to the prior art.

A load abnormality detecting system in accordance with the invention is illustrated in the circuit diagram of FIG. 1 and is identified generally by the numeral 30. The load abnormality detecting system 30 is mounted, for example, in a vehicle and capable of detecting the burnout, short circuit and/or other abnormality of a lamp or a like load present outside the load abnormality detecting system 30.

As shown in FIG. 1, the load abnormality detecting system 30 includes a current sensor 1, a transistor Tr1, a voltage generator 10 and a microcomputer 20. It should be noted that the load 2 and a power supply Vo are or may be present outside the load abnormality detecting system 30 (double circles in FIG. 1 represent connection points of the load abnormality detecting system 30 with the outside or components external to system 30).

Here, the voltage generator 10 is preferably comprised of a first resistor R1, a second resistor R2 and a transistor Tr2. Further, an AD converter 3, a judging device 4, a selecting means 5 and/or a selector 6 are provided, preferably integrated into the microcomputer 20, wherein a burnout reference value T1 and a short-circuit reference value T2 are set or stored (particularly in a non-volatile manner, e.g., a non-volatile memory) in the microcomputer 20.

The power supply Vo is for supplying power to the load 2 such as a lamp.

The current sensor 1 is capable of generating a signal current Is in proportion to or corresponding to the load current IL flowing into the load 2. More specifically, the current sensor 1 outputs the load current IL inputted thereto to the load 2 and separately outputs the signal current Is. Here, a relationship of Is=IL/K (K: constant) preferably holds between the load current IL and the signal current Is.

The voltage generator 10 is a circuit portion capable of generating a specified (predetermined or predeterminable) voltage Vs substantially corresponding to an amount of the load current IL flowing into the load 2. More specifically, the voltage generator 10 can generate the voltage Vs based on the signal current Is in proportion to the load current IL.

The first resistor R1 as a component of the voltage generator 10 has a resistance value r1. Further, the second resistor R2 as a component of the voltage generator 10 has a resistance value r2. Further, the transistor (which can particularly be understood as a switching circuit) Tr2 as a component of the voltage generator 10 is provided for electrically connecting and separating the second resistor R2 and a reference potential (e.g. ground potential) of the circuit. The transistor Tr2 preferably is an npn transistor.

The microcomputer 20 controls other mounted circuit portions by a program stored (particularly in a non-volatile manner) in an unillustrated storage device such as a ROM or a RAM. The circuits 3, 4, 5, 6, etc. preferably incorporated or integrated into the microcomputer 20 (i.e., arranged in the microcomputer 20) have the following functions.

The AD converter 3 is a circuit portion for converting the voltage Vs (analog signal) generated in the voltage generator 10 into a digital signal. An upper limit preferably is defined for a voltage value to be inputted to the AD converter 3 based on the electrical specification and the like of the AD converter 3 incorporated into the microcomputer 20.

The judging device 4 compares the digital signal value (which can be understood as a signal value corresponding to the specified voltage Vs) outputted from the AD converter 3 with a burnout reference value T1 and/or a short-circuit reference value T2. Then, the judging device 4 judges whether or not the load 2 has any abnormality (burnout or short circuit) as a result of the comparison. Here, the burnout reference value T1 and the short-circuit reference value T2 preferably are or can be set in the microcomputer 20 beforehand.

The selector 6 is a switching portion for selectively inputting one of the burnout reference value T1 and the short-circuit reference value T2 to one input portion of the judging device 4. The selector 6 controls the selective input of the reference values T1, T2 via the selecting means 5. The selector 6 executes a control as to whether or not to form a current path from the current sensor 1 to the reference potential via the second resistor R2 and the transistor Tr2 (preferably in this order) preferably by controlling the voltage generator 10. Here, the current path is controllably formed by on-off controlling the transistor Tr2 in accordance with a specified (predetermined or predeterminable) control signal outputted from the selector 6.

The microcomputer 20 on-off controls the pnp transistor Tr1. The transistor Tr1 may be another switching device such as a power MOS-FET.

The pnp transistor Tr1 and the current sensor 1 are connected in series between the power supply Vo and the load 2. Here, one output portion of the current sensor 1 and the load 2 are connected. Further, an emitter of the transistor Tr1 and the power supply Vo are connected, and a collector of the transistor Tr1 and the input portion of the current sensor 1 are connected. It should be noted that a base of the transistor Tr1 is connected to the microcomputer 20.

By the above construction, the load current IL flows from the power supply Vo into the load 2 via the transistor Tr1 in its on-state and the current sensor 1.

Further, the other output portion of the current sensor 1 and an input portion of the AD converter 3 arranged in the microcomputer 20 are connected. Here, the signal current Is (=IL/K) in proportion or corresponding to the load current IL is outputted from this other output portion.

A wire which is laid between the current sensor 1 and the microcomputer 20 and in which the signal current Is flows (this wire is or may be connected to another input portion of the judging device 4 via the AD converter 3 of FIG. 1 as described later) has respective one or more connection points.

The voltage generator 10 is disposed between the connection points and the reference potential (e.g. ground potential) of the circuit.

More specifically, two connection points N1, N2 are provided in the wire in which the above signal current Is flows. The first resistor R1 is disposed between the connection point N1 and the reference potential (e.g. ground). Further, the second resistor R2 and the transistor (which can be understood as a switching circuit) Tr2 are arranged in series in this order between the connection point N2 and the reference potential (e.g., ground). Here, the collector of the transistor Tr2 is connected to the second resistor R2 and an emitter thereof is connected to the reference potential (e.g. ground).

As can be understood from the above construction, the first resistor R1 and the second resistor R2 are connected in parallel between the above wire and the reference potential (e.g. ground).

The judging device 4 is arranged in the microcomputer 20 as described above. One input portion of the judging device 4 and an output portion of the selecting means 5 likewise arranged in the microcomputer 20 are connected. Here, the burnout reference value T1 set in a register, table, map or relationship or the like is fed to one end of switchable input portion of the selecting means 5 and the short-circuit reference value T2 set in another register, table, map or relationship or the like is fed to the other end of the switchable input portion of the selecting means 5.

The other input portion of the judging device 4 is connected to the other output portion of the current sensor 1 via the AD converter 3 and the connection points N1, N2. Here, as can be understood from FIG. 1, the AD converter 3 is arranged in the microcomputer 20 and the connection points N1, N2 are present outside the microcomputer 20.

A judgment result as to whether or not the load 2 has any abnormality is outputted from the output portion of the judging device 4.

The selector 6 is arranged or integrated in the microcomputer 20. This selector 6 is connected to the selecting means 5 and a base of the transistor Tr2. In this construction, the selector 6 controls the switching of the selecting means 5 and the transistor Tr2.

It is assumed that the load current IL flows from the power supply Vo to the load 2 and the signal current Is (=IL/K) flows from the current sensor 1 to the microcomputer 20. It is assumed that a check is made as to whether or not the load 2 has been burnt out (or is about to be burnt out) in this state.

In this case, the selector 6 controls the switching of the selecting means 5 so that the burnout reference value T1 is inputted to the one input portion of the judging device 4. The selector 6 also controls the voltage generator 10 so as not to form a current path via the second resistor R.

Specifically, the selector 6 inputs such a control signal as to turn the transistor Tr2 off to the base of the transistor Tr2. The current path via the second resistor R2 is not formed by such a control of the transistor Tr2 by the selector 6. There particularly is still a possibility that a small leakage current flows even if the transistor Tr2 is turned off, but this leakage current is very small and no substantially current flows. Therefore, it can be understood that no current path via the second resistor R2 is formed in this case as well.

When the respective controls of the selector 6 are completed, the burnout reference value T1 is inputted to the one input portion of the judging device 4. Further, the voltage generator 10 generates the voltage Vs.

Here, at the time of checking the burnout of the load 2, this voltage Vs is Is (signal current)×r1 (resistance value of the resistor R1). This voltage Vs is converted into a digital signal in the AD converter 3 arranged in the microcomputer 20 and, thereafter, this digital signal is inputted to the other input portion of the judging device 4.

Subsequently, the judging device 4 compares this digital signal and the burnout reference value T1. As a result of the comparison, the judging device 4 outputs a judgment signal representing whether or not burnout has occurred (or is about to occur).

Next, a check as to whether the load 2 has short-circuited (or is about to short-circuit) is described.

In this case, the selector 6 controls the switching of the selecting means 5 so that the short-circuit reference value T2 is inputted to the one input portion of the judging device 4. The selector 6 also controls the voltage generator 10 so as to form the current path via the second resistor R2.

Specifically, the selector 6 inputs such a control signal as to turn the transistor Tr2 on to the base of the transistor Tr2. The current path via the second resistor R2 is formed by such a control of the transistor Tr2 by the selector 6.

Particularly when the respective controls of the selector 6 are completed, the short-circuit reference value T2 is inputted to the one input portion of the judging device 4. Further, the voltage generator 10 generates the voltage Vs.

Here, as can be understood from the above, the voltage generator 10 preferably has such a construction in which the resistors R1 and R2 are connected in parallel at the time of checking the short circuit of the load 2. Accordingly, the voltage Vs is Is (signal current)×{r1 (resistance value of the resistor R1)//r2(resistance value of the resistor R2)} or in other words, $$Vs = Is \times \{r1 \cdot r2/(r1+r2)\}.$$

The voltage Vs is converted into a digital signal in the AD converter 3 preferably arranged or provided in the microcomputer 20 and, thereafter, this digital signal is inputted to the other input portion of the judging device 4.

The above synthetic resistance value {r1·r2/(r1+r2)} is apparently smaller than the resistance value r1.

Subsequently, the judging device 4 compares this digital signal and the short-circuit reference value T2. As a result of the comparison, the judging device outputs a judgment signal representing whether or not short circuit has occurred (or is about to occur).

As described above, the voltage generator 10 generates the specified voltage Vs only based on the resistance value r1 at the time of checking the burnout of the load 2 in the load abnormality detecting system 30. Further, the voltage generator 10 generates the specified voltage Vs based on the synthetic resistance value {r1·r2/(r1+r2)} at the time of checking the short circuit of the load.

Accordingly, even if an upper limit is defined for the voltage value inputted to the AD converter 3 arranged in the microcomputer 20, the load abnormality detecting system 30 according to the preferred embodiment of the present invention can detect the burnout of the load 2 with better accuracy than the load abnormality detecting system 30 according to prior art.

In the load abnormality detecting system 30 according to the preferred embodiment of the present invention, the voltage generator 10 preferably includes the transistor (switching circuit) Tr2 having the above construction. The selector 6 outputs such a control signal as to turn the transistor Tr2 off in the case of detecting the burnout of the load 2 while outputting such a control signal as to turn the transistor Tr2 on in the case of detecting the short circuit of the load 2.

Accordingly, by a simple construction, the specified voltage Vs can be generated only based on the resistance value r1 at the time of checking the burnout of the load and can be generated based on the synthetic resistance value {r1·r2/(r1+r2)} at the time of checking the short circuit of the load.

What is claimed is:

1. A load abnormality detecting system, comprising:

a voltage generator for generating a specified voltage (Vs) in accordance with an amount of a current (IL) flowing to a load present outside of the system, a judging device for judging whether or not the load has any abnormality by comparing a signal corresponding to the specified voltage (Vs) and a burnout reference value (T1) and/or a short-circuit reference value (T2), and a selector for causing either one of the burnout reference value (T1) and the short-circuit reference value (T2) to be selectively inputted to one input portion of the judging device, wherein:

the voltage generator includes a first resistor (R1) disposed between the other input portion of the judging device and a reference potential, and a second resistor (R2) connected in parallel with the first resistor (R1) between the other input portion of the judging device and the reference potential, and the selector causes the burnout reference value (T1) to be inputted to the one input portion of the judging device and controls the voltage generator so as not to form a current path via the second resistor (R2) in the case of checking the burnout of the load while causing the short-circuit reference value (T2) to be inputted to the one input portion of the judging device and controlling the voltage generator so as to form the current path via the second resistor (R2) in the case of checking the short circuit of the load, wherein specified voltage Vs is given by $$Vs = Is \times \{r1 \cdot r2/(r1+r2)\}$$

where Is is a signal current corresponding to the current flowing to the load, r1 is the resistance value of the first resistor (R1), and r2 is the resistance value of the second resistor (R2).

2. The load abnormality detecting system of claim 1, wherein the voltage generator further includes a switching circuit (Tr2) connected in series with the second resistor (R2) between the other input portion of the judging device and the reference potential and on-off controlled in accordance with a control signal from the selector.

3. The load abnormality detecting system of claim 2, wherein the selector outputs such a control signal as to turn the switching circuit (Tr2) off in the case of detecting the burnout of the load while outputting such a control signal as to turn the switching circuit (Tr2) on in the case of detecting the short circuit of the load.

4. A load abnormality detecting method comprising the following steps:

a generating step of generating a specified voltage (Vs) in accordance with an amount of a current (IL) flowing to a load present outside, a judging step of judging whether or not the load has any abnormality by comparing a signal corresponding to the specified voltage (Vs) and a burnout reference value (T1) and/or a short-circuit reference value (T2) by a judging device, and a selecting step for causing either one of the burnout reference value (T1) and the short-circuit reference value (T2) to be selectively inputted to one input portion of the judging device, wherein:

in the generation step the specified voltage is generated by disposing a first resistor (R1) between the other input portion of the judging device and a reference potential, and connecting a second resistor (R2) in parallel with the first resistor (R1) between the other input portion of the judging device and the reference potential, and in the selecting step it is caused to input the burnout reference value (T1) to the one input portion of the judging device and avoided to form a current path via the second resistor (R2) in the case of checking the burnout of the load while it is caused to input the short-circuit reference value (T2) to the one input portion of the judging device and the current path is formed via the second resistor (R2) in the case of checking the short circuit of the load, wherein specified voltage Vs is given by $$Vs=Is\times\{r1\cdot r2/(r1+r2)\}$$

where Is is a signal current corresponding to the current flowing to the load, r1 is the resistance value of the first resistor (R1), and r2 is the resistance value of the second resistor (R2).

5. The load abnormality detecting method of claim 4, wherein the voltage generation step further includes a switching step by means of a switching circuit (Tr2) connected in series with the second resistor (R2) between the other input portion of the judging device and the reference potential and on-off controlled in accordance with a control signal from the selector.

6. The load abnormality detecting method of claim 5, wherein the in the selecting step a control signal is output so as to turn the switching circuit (Tr2) off in the case of detecting the burnout of the load while a control signal is output so as to turn the switching circuit (Tr2) on in the case of detecting the short circuit of the load.

7. A load abnormality detecting system, comprising:

a voltage generator for generating a specified voltage (Vs) in accordance with an amount of a current (IL) flowing to a load coupled to the system;

a judging device for judging whether or not the load has any abnormality by comparing a signal corresponding to the specified voltage (Vs) to at least one of a burnout reference value (T1) and a short-circuit reference value (T2); and a selector (6) for selecting either one of the burnout reference value (T1) and a short-circuit reference value (T2) to be input to the judging device and for selecting a corresponding first and second resistance value to be used by the voltage generator for generating the specified voltage, wherein:

the voltage generator includes a first resistor (R1) disposed between a first input portion of the judging device and a reference potential, and a second resistor (R2) connected in parallel with the first resistor (R1) between the first input portion of the judging device and the reference potential, the first resistance value being approximately equal to a resistance value of the first resistor (R1) and the second resistance value being approximately equal to a total parallel resistance of the first resistor (R1) and the second resistor (R2).

8. The load abnormality detecting system of claim 7, wherein:

the selector causes the burnout reference value (T1) to be inputted to a second input portion of the judging device and controls the voltage generator so as not to form a current path via the second resistor (R2) in the case of checking the burnout of the load while causing the short-circuit reference value (T2) to be inputted to the second input portion of the judging device and controlling the voltage generator so as to form the current path via the second resistor (R2) in the case of checking the short circuit of the load.

9. The load abnormality detecting system of claim 8, wherein the voltage generator further includes a switching circuit (Tr2) connected in series with the second resistor (R2) between the first input portion of the judging device and the reference potential and on-off controlled in accordance with a control signal from the selector.

10. The load abnormality detecting system of claim 9, wherein the selector outputs such a control signal as to turn the switching circuit (Tr2) off in the case of detecting the burnout of the load while outputting such a control signal as to turn the switching circuit (Tr2) on in the case of detecting the short circuit of the load.

11. The load abnormality detecting system of claim 7, wherein specified voltage Vs is given by $$Vs=Is\times\{r1\cdot r2/(r1+r2)\}$$

where Is is the signal current corresponding to the current flowing to the load, r1 is the resistance value of the first resistor (R1), and r2 is the resistance value of the second resistor (R2).

\* \* \* \* \*